(12) United States Patent
Kim et al.

(10) Patent No.: US 8,045,400 B2
(45) Date of Patent: Oct. 25, 2011

(54) CIRCUIT AND METHOD FOR CONTROLLING READ CYCLE

(75) Inventors: Je-Yoon Kim, Gyeonggi-do (KR); Jong-Chern Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 309 days.

(21) Appl. No.: 12/495,269

(22) Filed: Jun. 30, 2009

(65) Prior Publication Data

US 2010/0290263 A1     Nov. 18, 2010

(30) Foreign Application Priority Data

May 18, 2009   (KR) .......................... 10-2009-0043090

(51) Int. Cl.
*G11C 7/00*     (2006.01)
(52) U.S. Cl. .............................. 365/189.12; 365/233.18
(58) Field of Classification Search ............. 365/189.12, 365/233.18
See application file for complete search history.

(56) References Cited

U.S. PATENT DOCUMENTS 6,111,815 A * 8/2000 Takeda ......................... 365/236

FOREIGN PATENT DOCUMENTS

| KR | 1019980046101 | 9/1998 |
| KR | 1020080061010 | 7/2008 |

OTHER PUBLICATIONS

Notice of Allowance issued from Korean Intellectual Property Office on Jan. 31, 2011.
Notice of Preliminary Rejection issued from Korean Intellectual Property Office on Nov. 25, 2010.

* cited by examiner

*Primary Examiner* — Son Dinh
*Assistant Examiner* — Nam Nguyen
(74) *Attorney, Agent, or Firm* — IP & T Group LLP

(57) ABSTRACT

A circuit for controlling the read cycle includes plurality of shift stages configured to sequentially shift read signals; and an activating unit configured to activate a read cycle signal which represents a read cycle, by performing logical operation for output signals of the plurality of shift stages, wherein the plurality of shift stages are configured to sequentially shift the read signals for a period corresponding to burst setting information.

7 Claims, 4 Drawing Sheets

CIRCUIT AND METHOD FOR CONTROLLING READ CYCLE

CROSS-REFERENCE TO RELATED APPLICATIONS

The present application claims priority of Korean Patent Application No. 10-2009-0043090, filed on May 18, 2009, the disclosure of which is incorporated herein by reference in its entirety.

BACKGROUND OF THE INVENTION

The present invention relates to a semiconductor memory device, and more particularly, to a technology for controlling a read cycle of a semiconductor memory device.

A semiconductor memory device continuously outputs the number of bits of data depending on a Burst length BL. For a burst length BL of 4, 4 bits of data are continuously outputted, and for a burst length BL of 8, 8 bits of data are continuously outputted. Therefore, a duration of a read cycle of the semiconductor memory device varies depending on a set value of the burst length BL.

FIG. 1 is a block diagram of a circuit for controlling a conventional read cycle.

As shown in FIG. 1, the circuit for controlling the conventional read cycle includes an SR latch 110, and a counter block 120.

The SR latch 110 activates a read cycle signal ROUTEN in response to a read signal RD, and inactivates a read cycle signal ROUTEN in response to a reset signal RST.

The counter block 120 activates the reset signal RST after 2 clock cycles or 4 clock cycles from a timing point at which read cycle signal ROUTEN is activated. The timing point at which the counter block activates the reset signal is determined by burst setting information. When the burst length BL is set to 8, the counter block activates a reset signal RST after 4 clock cycles from the timing point at which the read cycle signal ROUTEN is activated. When the burst length BL is set to 4, the counter block activates a reset signal RST after 2 clock cycles from the timing point at which the read cycle signal ROUTEN is activated.

The read signal RD is activated when a read commend is applied from an outside of a chip, and the read cycle signal ROUTEN is used to define a period at which bits of data are outputted from the memory device. Therefore, the read cycle signal ROUTEN has a period varied depending on the burst length BL.

FIGS. 2A and 2B are timing diagrams illustrating an operation of FIG. 1.

FIG. 2A illustrates an operation of the circuit for controlling the read cycle when the burst length BL is set to 4 (in a BC4 mode for DDR3 where a BL4 is impossible in principle). FIG. 2B illustrates an operation of the circuit for controlling the read cycle when the burst length BL is set to 8.

Referring to FIG. 2A, the SR latch 110 activates the read cycle signal ROUTEN simultaneously while the read signal RD is active.

The counter block 120 activates the reset signal RST after 2 clock cycles from the timing point at which the read cycle signal ROUTEN is activated. Then, the SR latch 110 inactivates the read cycle signal ROUTEN in response thereto. In this case, the read cycle signal ROUTEN is active for 2 clock cycles, which corresponds to time required for stream output of 4 bits of data.

Referring to FIG. 2B, the SR latch 110 activates the read cycle signal ROUTEN simultaneously with the activation of the read signal RD. The counter block 120 activates the reset signal RST after 4 clock cycles from the timing point at which the read cycle signal ROUTEN is activated. Then, the SR latch 100 inactivates the read cycle signal ROUTEN in response thereto. In this case, the read cycle signal ROUTEN is active for 4 clock cycles, which corresponds to time required for stream output of 8 bits of data.

FIG. 3 is a timing diagram illustrating a problem with respect to the circuit for controlling the conventional read cycle shown in FIG. 1 when a read command is continuously applied.

Due to a short margin for distinguishing signals in the semiconductor memory device, the reset signal RST is not activated at an accurate timing, and is activated after a slight delay. FIG. 3 illustrates such a problem.

As shown in FIG. 3, when a reset signal RST 304 corresponding to a first read signal RD 301 is activated at a timing later than that of a second read signal RD 302, a read cycle signal ROUTEN corresponding to the second read signal RD 302 is inactivated simultaneously while the reset signal RST 304 is active. Therefore, in this case, a read cycle corresponding to the second read signal RD 302 is skipped, and a read operation fails to be performed in the memory device.

SUMMARY OF THE INVENTION

An embodiment of the present invention is directed to providing a circuit and a method for controlling a read cycle, so that the read cycle can be correctly formed in semiconductor memory device, even when a read command is continuously applied.

In accordance with an aspect of the present invention, there is provided a circuit for controlling a read cycle, including: a plurality of shift stages configured to sequentially shift read signals; and an activating unit configured to activate a read cycle signal which represents a read cycle, by performing logical operation for output signals of the plurality of the shift stages, wherein the plurality of the shift stages are configured to sequentially shift the read signals for a period corresponding to burst setting information.

Each of the plurality of the shift stages may shift a corresponding input signal by one clock cycle at a time, and output the resultant signal.

Some of the plurality of the shift stages may be inactivated according to the burst setting information.

The read cycle signal is active during the periods at which any of the output signals of plurality of shift stages is active.

The activation unit may generate the read cycle signal by summing up periods at which the plurality of the shift stages are activated.

In accordance with another aspect of the present invention, there is provided a method for controlling a read cycle including: receiving a read signal; sequentially shifting the read signal for a period corresponding to burst setting information; and generating a read cycle signal by using the sequentially shifted signal.

In sequentially shifting the read signal, the read signal may be shifted by one clock cycle unit at a time for a period corresponding to the burst setting information.

The read cycle signal may be active during the periods at which any of the shifted signals is active.

The read cycle signal may be generated by summing up periods at which the shifted signals are active.

DESCRIPTION OF SPECIFIC EMBODIMENTS

Other objects and advantages of the present invention can be understood by the following description, and become apparent with reference to the embodiments of the present invention.

Figure 1:
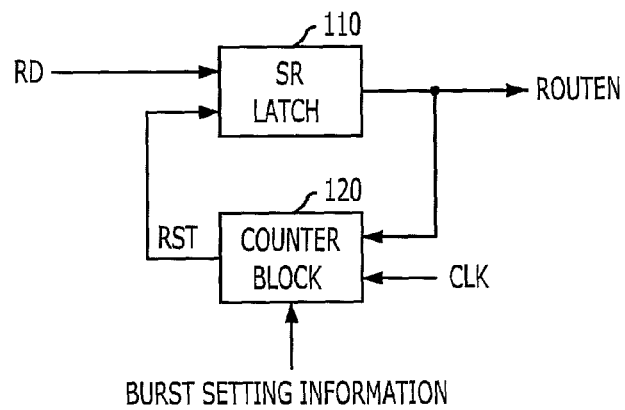
FIG. 1 is a block diagram of a circuit for controlling a conventional read cycle.
Figure 2A:
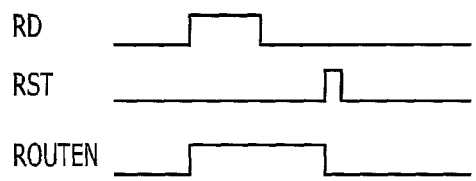
FIGS. 2A and 2B are timing diagrams illustrating an operation of FIG. 1.
Figure 2B:
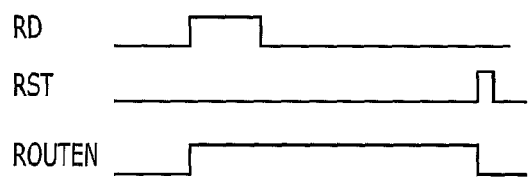
Figure 3:
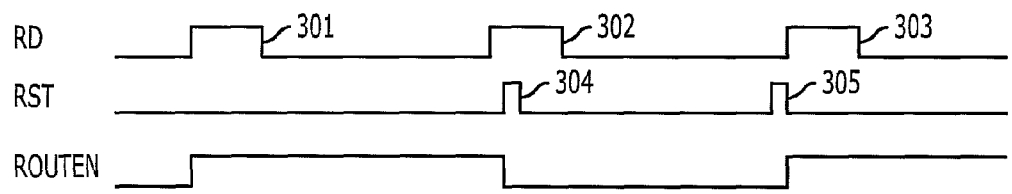
FIG. 3 illustrates a problem occurring in the circuit for controlling the read cycle shown in FIG. 1 when a read command continues to be applied.
Figure 4:
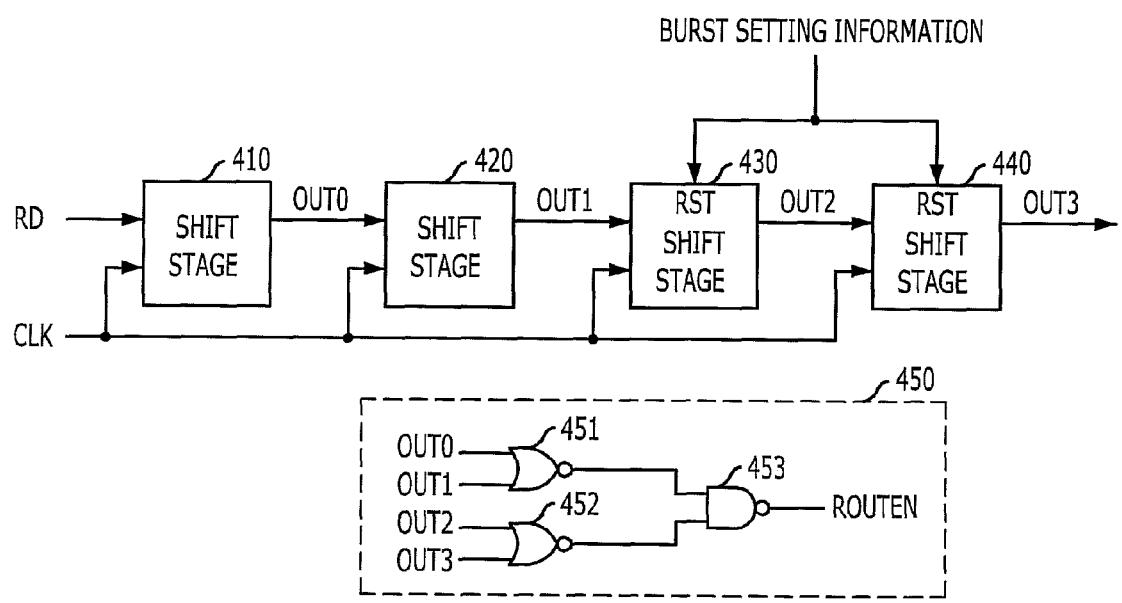
FIG. 4 is a block diagram of a circuit for controlling a read cycle in accordance with one embodiment of the present invention

FIG. 4 is a block diagram illustrating a circuit for controlling a read cycle in accordance with one embodiment of the present invention.

As shown in FIG. 4, the circuit for controlling the read cycle in accordance with the present invention includes a plurality of shift stages 410 to 440 for sequentially shifting a read signal, and an activating unit 450 for activating a read cycle signal ROUTEN that represents a read cycle by using output signals OUT0 to OUT4 of the shift stages 410 to 440, which sequentially shift a read signal RD by a period corresponding to burst setting information.

The shift stages 410 to 440 each shift its own input signal by one clock cycle in response to a clock CLK. Reset or no-reset of shift stages 430 and 440 is determined by the burst setting information. When the burst setting information is set to BL4 or a BC4 mode (which is a mode to enable an operation and is used instead of the BL4 because a DDR3 DRAM cannot have a BL4 mode in design), the shift stages 430 and 440 are reset, which means that output signals OUT2 and OUT3 of the shift stages 430 and 440 are fixed to 'low', regardless of input signals. That is, when the shift stages 430 and 440 are reset, the shift operations of the shift stages 430 and 440 are inactivated. Reset or no-reset of the remaining shift stages 410 and 420 fails to be controlled by the burst setting information. The shift stages 410 and 420 fail to be reset for a period at which the memory device is normally operated.

The activating unit 450 generates a read cycle signal ROUTEN in response to the output signals OUT0 to OUT3 of the shift stages 410 to 440. The activating unit 450 may include a NOR gate 451 for receiving output signals OUT0 and OUT1, a NOR gate 452 for receiving output signals OUT2 and OUT3, and a NAND gate 453 for receiving outputs of the NOR gates 451 and 452 and outputting a read cycle signal ROUTEN. When any one of the output signals OUT0 to OUT3 is activated, the activating unit 450 activates a read cycle signal ROUTEN. Therefore, the read cycle signal ROUTEN is a signal being active during the periods that any of the output signals OUT0 to OUT3 is active.

Figure 5A:
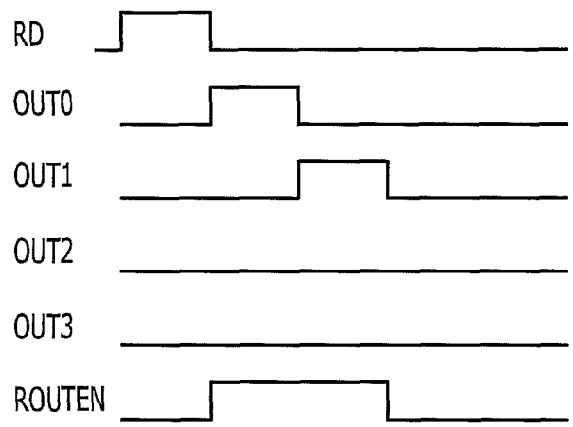
FIGS. 5A and 5B are timing diagrams illustrating an operation of FIG. 4.
Figure 5B:
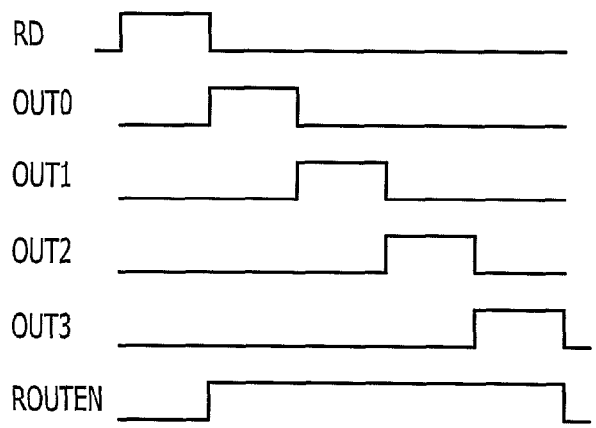

FIGS. 5A and 5B are timing diagrams illustrating an operation of FIG. 4.

FIG. 5A illustrates an operation of the circuit for controlling the read cycle when the burst length BL is set to 4 (or, a case of all BC4).

FIG. 5B illustrates an operation of the circuit for controlling the read cycle when the burst length BL is set to 8.

Referring to FIG. 5A, the read signal RD is shifted by one clock cycle by the shift stages 410 and 420, and thus output signals OUT0 and OUT1 are activated one by one. When the burst length BL is set to 4, the shift stages 430 and 440 are in a reset state, and thus the output signals OUT2 and OUT3 continue to maintain a 'low' level although the read signal RD is active. The activating unit 450 activates the read cycle signal ROUTEN by summing up the periods at which the output signals OUT0 and OUT2 are active. Therefore, the read cycle signal ROUTEN is active for 2 clock cycles, which corresponds to a period of time required for output of 4 bits of data.

Referring to FIG. 5B, when the burst length BL is set to 8, the read signal RD is shifted by one clock cycle at a time by the shift stages 410 and 420, and activates the output signals OUT0 to OUT3 one by one. The activating unit 450 activates the read cycle signal ROUTEN during the periods when any of the output signals OUT0 to OUT3 is active. Therefore, the read cycle signal ROUTEN is active for 4 clock cycles, which corresponds to a period of time required for output of 8 bits of data.

The conventional read cycle signal ROUTEN has been activated simultaneously while the read signal RD is active. However, in the embodiment of the present invention, the read cycle signal ROUTEN is activated after passage of time equal to as much as one clock cycle from a period in time at which the read signal RD is active. The conventional read signal RD is controlled to be activated faster by one clock cycle than that resulting in no difference between times.

Figure 6:
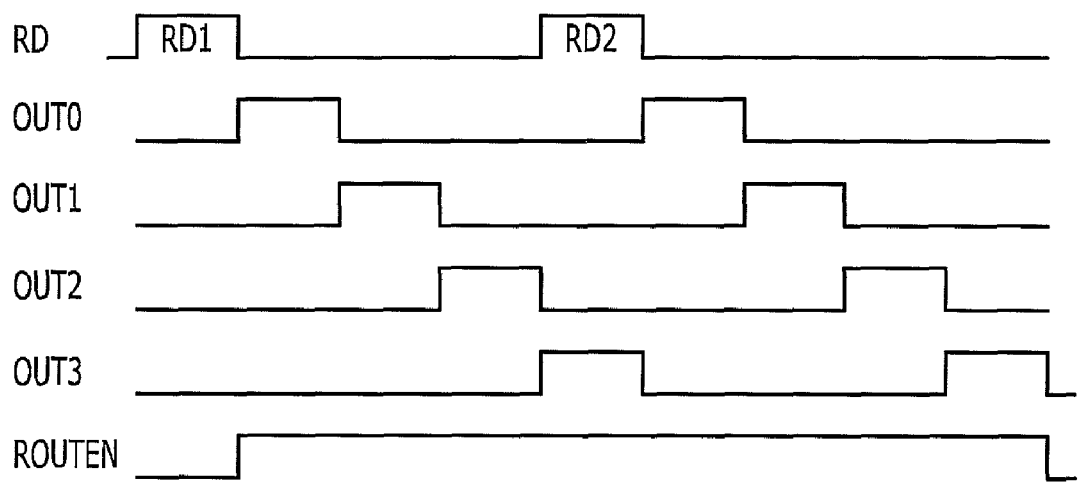
FIG. 6 is a timing diagram illustrating an operation of FIG. 4 when a burst length BL is set to 8 and a read command continues to be applied.

FIG. 6 is a time diagram illustrating an operation of FIG. 4 when the circuit for controlling the read cycle is set to 8, and a read command continues to be applied.

Referring to FIG. 6, a first read signal RD1 is sequentially shifted by the shift stages 410 to 440, and thus output signals OUT0 to OUT3 are activated one by one.

Further, a second read signal RD2 is sequentially shifted by the shift stages 410 to 440, and thus output signals OUT0 to OUT3 are activated one by one sequentially. Then, the activating unit 450 activates a read cycle signal ROUTEN by summing up all periods at which the output signals OUT0 to OUT3 are active. As a result, the read cycle signal ROUTEN is active for 8 clock cycles, which corresponds to time required for output of 16 bits of data outputted by 2 read commands.

In the present invention, the read cycle signal ROUTEN is generated by shifting the read signal RD by a period corresponding to a burst length BL, and summing up the shifted signals. Therefore, even if the read command continues to be applied, there is no problem in that the read cycle signal ROUTEN is not activated.

A description will be given of a method for controlling the read cycle in accordance with present invention, with reference to FIGS. 4 and 6.

The method for controlling the read cycle includes a step of receiving a read signal RD, a step of sequentially shifting the read signal RD until a period at which the read signal RD corresponds to the burst setting information, and a step of generating a read cycle signal ROUTEN by using the sequentially shifted signals OUT0 to OUT3.

In the step of shifting the read signal RD, the read signal RD is shifted by one clock cycle until a period at which the read signal RD corresponds to the burst setting information. Also, the read cycle signal ROUTEN is generated by summing up periods at which the shifted signals OUT0 to OUT3 are active.

A circuit for controlling a read cycle in accordance with the present invention generates a read cycle signal in a scheme for shifting read signals and summing up the shifted signals. Therefore, even if there is a problem in signal margins for a chip, such a problem does not surface in that the read cycle signal is not generated.

While the present invention has been described with respect to the specific embodiments, it will be apparent to those skilled in the art that various changes and modifications may be made without departing from the spirit and scope of the invention as defined in the following claims.

In particular, in the above-described embodiment, it has been illustrated that when a burst length BL is set to 4 or 8, a read cycle signal is generated. However, it is obvious that when the burst length BL may be set to 16 or 32, a read cycle signal may be generated in the similar principle to that of the above-described embodiment.

What is claimed is:

1. A circuit for controlling a read cycle, comprising:
   a plurality of shift stages configured to sequentially shift read signals; and
   an activating unit configured to activate a read cycle signal which represents a read cycle, by using output signals of the plurality of the shift stages,
   wherein the plurality of the shift stages are configured to sequentially shift the read signals for a period corresponding to burst setting information.

2. The circuit for controlling the read cycle of claim 1, wherein each of the plurality of the shift stages is configured to shift a corresponding input signal of the shift stage by one clock cycle at a time, and output the resultant signal.

3. The circuit for controlling the read cycle of claim 1, wherein some of the plurality of the shift stages are configured to be inactivated according to the burst setting information.

4. The circuit for controlling the read cycle of claim 1, wherein the read cycle signal is active during the period at which the output signals of plurality of shift stages is active.

5. A method for controlling a read cycle, comprising:
   receiving a read signal;
   sequentially shifting the read signal for a period corresponding to burst setting information; and
   generating a read cycle signal by using the sequentially shifted signal.

6. The method for controlling the read cycle of claim 5, wherein, in sequentially shifting the read signal, the read signal is shifted by one clock cycle unit at a time for a period corresponding to the burst setting information.

7. The method for controlling the read cycle of claim 5, wherein the read cycle signal is active during the period at which the shifted signals is active.

* * * * *